United States Patent
Clark et al.

(10) Patent No.: US 6,816,829 B1
(45) Date of Patent: Nov. 9, 2004

(54) SYSTEM AND METHOD TO INDEPENDENTLY VERIFY THE EXECUTION RATE OF INDIVIDUAL TASKS BY A DEVICE VIA SIMULATION

(75) Inventors: Robert Franklin Clark, Cary, NC (US); Robert Brian Likovich, Jr., Raleigh, NC (US); Darryl Jonathan Rumph, Cary, NC (US); Chad Everett Winemiller, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/477,163

(22) Filed: Jan. 4, 2000

(51) Int. Cl.[7] .................... G06F 13/10; G06F 13/12; G06F 9/44; G06F 17/50; G06F 15/173; G06G 7/62

(52) U.S. Cl. ..................... 703/21; 703/13; 709/223

(58) Field of Search ................. 703/21, 13; 709/223

(56) References Cited

U.S. PATENT DOCUMENTS

| | | | |
|---|---|---|---|
| 4,393,498 A | * 7/1983 | Jackson et al. | 714/46 |
| 4,744,084 A | * 5/1988 | Beck et al. | 714/33 |
| 5,042,027 A | 8/1991 | Takase et al. | 370/54 |
| 5,488,713 A | 1/1996 | Norton et al. | 395/500 |
| 5,583,792 A | 12/1996 | Li et al. | 370/514 |
| 5,671,402 A | * 9/1997 | Nasu et al. | 712/227 |
| 5,708,839 A | 1/1998 | Wiles et al. | 395/800 |
| 5,754,831 A | * 5/1998 | Berman | 703/13 |
| 5,794,012 A | 8/1998 | Averill | 395/500 |
| 5,812,414 A | 9/1998 | Butts et al. | 364/489 |
| 5,841,967 A | 11/1998 | Sample et al. | 395/83.09 |
| 6,175,814 B1 | * 1/2001 | Chrysos et al. | 702/182 |

OTHER PUBLICATIONS

Technical Disclosure Bulletin 12–70, Determining Instruction Rates of Computer Processors, A. L. Anthony and H. K. Watson p. 2019–2021.

Technical Disclosure Bulletin 12–88, "Instruction Execution Rate Performance Measurements on a Pipelined Multi–Function Unit Processor", J. R. Rodriguez. P. 378–385.

* cited by examiner

*Primary Examiner*—Kevin J. Teska
*Assistant Examiner*—Dwin M. Craig
(74) *Attorney, Agent, or Firm*—Joscelyn G. Cockburn; Paul Kraft

(57) ABSTRACT

The present invention describes a system and method for independently verifying the Execution Rate of individual tasks by a device through simulation. Described is a situation in which a system has a main device through which data flows to and from other devices. Bus transfers must fall within required rates. A simulation of the configuration utilizes models of the various devices, including the "Main device". This simulation is used to verify the data traffic and associated transfer rates. Data transfer includes random bursts, with randomly chosen periods between bursts. The data rate and data validity are measured during each burst period.

9 Claims, 3 Drawing Sheets

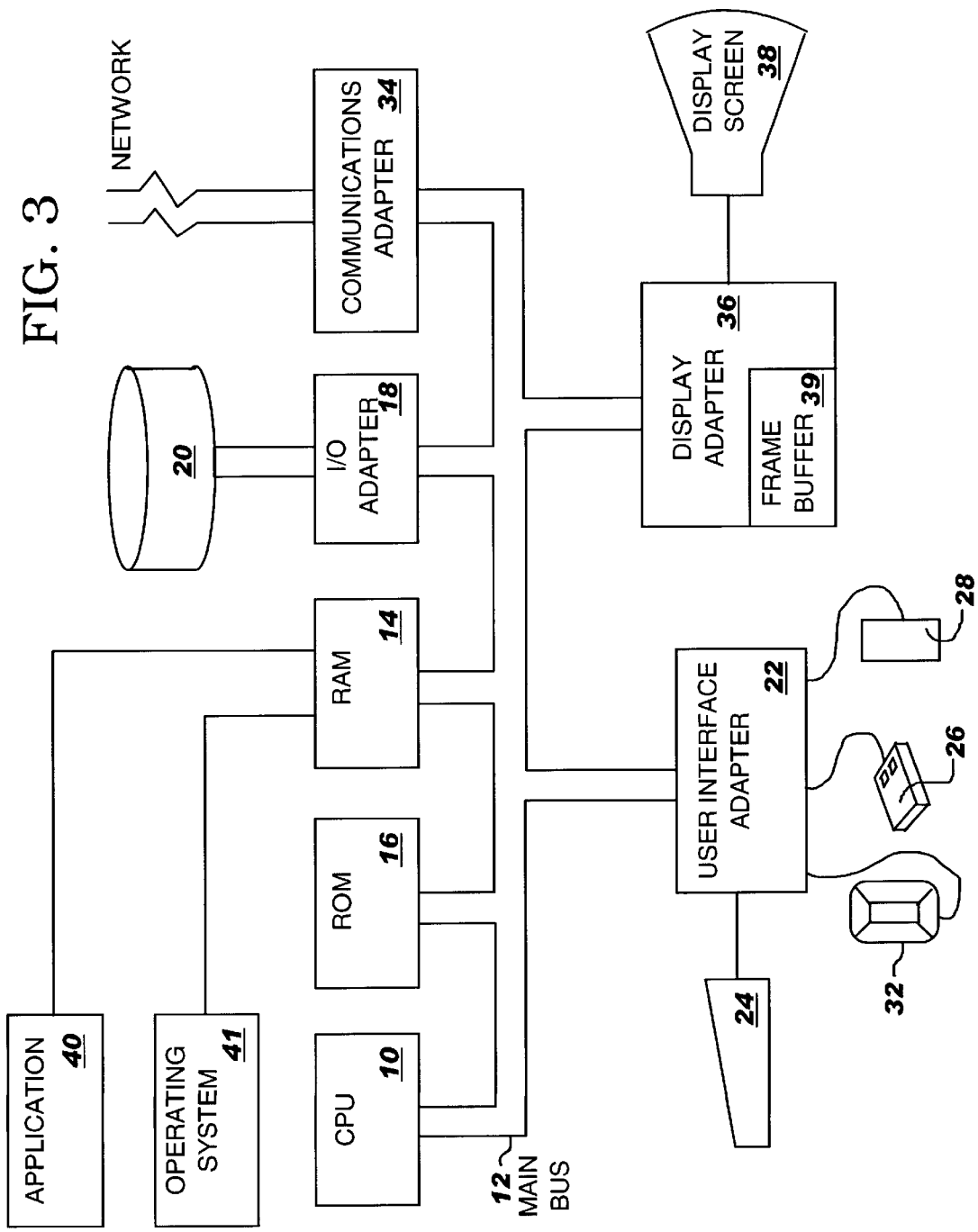

SYSTEM AND METHOD TO INDEPENDENTLY VERIFY THE EXECUTION RATE OF INDIVIDUAL TASKS BY A DEVICE VIA SIMULATION

TECHNICAL FIELD

On a computer network system, the present invention is involved in the area of independently verifying the Execution Rate of individual tasks by a device, through simulation.

BACKGROUND OF THE INVENTION

In recent years, "Simulation" has been used as a method for verification of logical correctness of complex electronic circuit designs. Simulation in broad terms can be considered as the creation of a model which, if subjected to arbitrary stimuli, responds in a similar way to the manufactured and tested design. More specifically, the term "simulation" is typically used when such a model is implemented as a computer program. Simulation saves a significant amount of time and financial resources because it enables designers to detect design errors before the very expensive manufacturing process is undertaken. Moreover, the design process itself can be viewed as a sequence of steps where the initial general concept of a new product is being turned into a detailed blueprint. Detecting errors at the early stages of this process also saves time and engineering resources.

Many computer systems have a main device through which data flows to and from several other secondary devices. The main device has to execute bus transfers with each of the other devices at a required rate. A common problem associated with this type of device is ensuring and verifying that the system can meet the execution rate requirement of the transmit and receive paths between the main device and each secondary device.

SUMMARY OF THE INVENTION

The present invention describes a system and method for independently verifying the Execution Rate of individual tasks by a device through "simulation". The present invention further describes a scenario in which a system has a main device through which data flows "to and from" other devices; however, bus transfers must fall within required rates.

In the present invention, a simulation of the configuration utilizes models of the various devices, including the "Main device". This simulation is used to verify the data traffic and associated transfer rates. Data transfer includes random bursts, with randomly chosen periods between bursts. Many systems have a main device through which data flows to and from several other secondary devices. The problem is to ensure that the device under test (DUT), can provide adequate bandwidth to and from each of the devices in the system.

Therefore a major embodiment of the present invention solves this problem of ensuring adequate bandwidth, by surrounding the DUT with models capable of providing random bursts across each bus. Yet another embodiment is that the present invention performs measurements on each individual bus against a performance criteria during each of the bursts, even when the burst rate across a particular bus is changing from one burst to the next. Part of that measurement is predicting the latency of the DUT. That is, the ability of the DUT to respond to a burst request in a timely fashion.

BRIEF DESCRIPTION OF THE DRAWINGS

FIG. 3 shows a block diagram of a data processing system.

DETAILED DESCRIPTION OF THE PREFERRED EMBODIMENT

Figure 1:
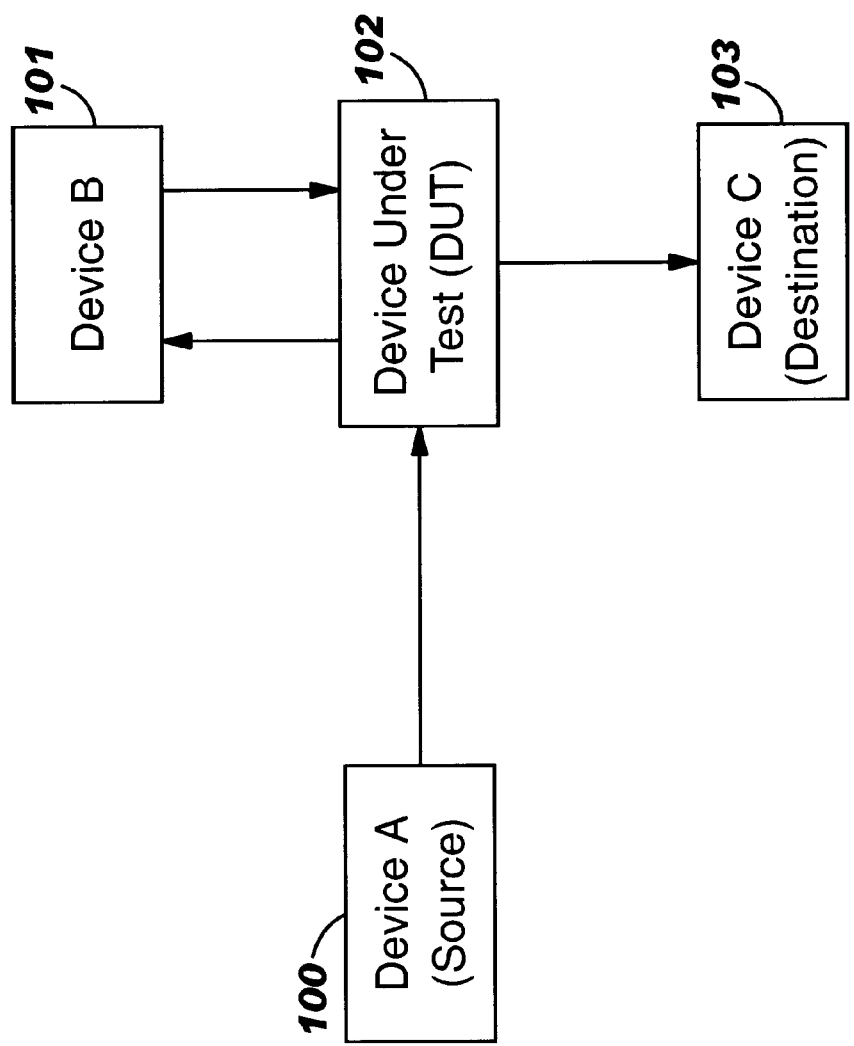
FIG. 1. shows a generalized example of the functions of a system with the type of configuration described in the Summary.

Before going into the details of the present invention, it would be helpful to the reader and to the understanding of this invention, to define specific definitions.

Definitions

Data Bursts: A temporary, high-speed data transfer mode, that under certain or ideal conditions, can transfer data at significantly higher "data transfer rates" than the rate normally achieved with a non-burst technology. For example, memory chips can be designed so that, under certain circumstances, a processor can write quickly to a matrix of memory locations, without having to address each of the locations individually.

DUT: This is defined as the device under test.

Buffer: A region of memory reserved for use as an intermediate repository in which data is temporarily held while waiting to be transferred between locations, as between an application's data area and an input/output device. A device or its adapter may in turn use a buffer to store data awaiting transfer to the computer or processing by the device.

Simulation: The imitation of a physical process or object by a program that causes a computer to respond mathematically to data and changing conditions as though it were the process or object itself.

General Computer Background: For purposes of general computer background, FIG. 3 is presented. It merely represents a typical block diagram of a data processing system including a central processing unit 10 and network connections via a communications adapter 34 which is capable of implementing the present invention. A central processing unit (CPU), such as one of the PowerPC microprocessors available from International Business Machines Corporation (PowerPC is a trademark of International Business Machines Corporation) is provided and interconnected to various other components by system bus 12. An operating system 41 runs on CPU 10 and provides control and is used to coordinate the function of the various components of FIG. 1. Operating system 41 may be one of the commercially available operating systems such as DOS, or the OS/2 operating system available from International Business Machines Corporation (OS/2 is a trademark of International Business Machines Corporation). A program application 40, runs in conjunction with operating system 41 and provides output calls to the operating system 41 which implements the various functions to be performed by the application 40.

A read only memory (ROM) 16 is connected to CPU 10, via bus 12 and includes the basic input/output system (BIOS) that controls the basic computer functions. Random access memory (RAM) 14, I/O adapter 18 and communications adapter 34 are also interconnected to system bus 12. It should be noted that software components including the operating system 41 and application 40 are loaded into RAM 14 which is the computer system's main memory. I/O adapter 18 may be a small computer system interface (SCSI) adapter that communicates with the disk storage device 20, i.e. a hard drive. Communications adapter 34 interconnects bus 12 with an outside network enabling the data processing system to communicate with other such systems over a local area network (LAN), wide area network (WAN), or the like. I/O devices are also connected to system bus 12 via user interface adapter 22 and display adapter 36. Keyboard 24, trackball 32, mouse 26 and speaker 28 are all interconnected to bus 12 through user interface adapter 22. Display adapter 36 includes a frame buffer 39 which is a storage device that holds a representation of each pixel on the display screen 38. Images may be stored in frame buffer 39 for display on monitor 38 through various components such as a digital to analog converter (not shown) and the like. By using the aforementioned I/O devices, a user is capable of inputting information to the system through the keyboard 24, trackball 32 or mouse 26 and receiving output information from the speaker 28 and display 38.

The present invention, as noted above in the Summary, describes a system and method for independently verifying the Execution Rate of individual tasks by a device through simulation. Described is a situation in which a system has a main device through which data flows "to and from" other devices. Bus transfers must fall within required rates. A simulation of the configuration utilizes models of the various devices, including the "Main device". This simulation is used to verify the data traffic and associated transfer rates. Data transfer includes random bursts, with randomly chosen periods between bursts. Many systems have a main device through which data flows to and from several other secondary devices. The problem is to ensure that the device under test (DUT) can provide adequate bandwidth to and from each of the devices in the system. Therefore, as noted earlier, a major embodiment of the present invention solves this problem by surrounding the DUT with models capable of providing random bursts across each bus.

Another significant embodiment of the present invention is that the present invention performs measurements on each individual bus against a performance criteria during each of the bursts, even when the burst rate across a particular bus is changing from one burst to the next.

FIG. 1 shows a generalized example of a system with this type of configuration. The data flow of FIG. 1 is described as follows. Device A is the source of the data at location 100. The data then flows to the DUT, at location 102, to Device B at location 101 and then returns to the DUT at location 102. From this point, the data exits the DUT and goes to Device C at location 103, which is the final destination.

The DUT has the ability to buffer data from Device A, as it may not have immediate access to send data to Device B.

Device B has the ability to buffer data from the DUT, as it may not have immediate access to send back to the DUT. Device B may also need to buffer data due to the fact that it may have to execute algorithms against a group of transfers and possibly change the order of data as it exists. While Device B buffers data, there may be data transfer activity on its input bus, but there may be no activity on its output bus.

At a later time, when the buffer in Device B is emptying, (i.e. there is activity on its output bus), there may be no activity on its input bus . The DUT may not be able to send data to device C (i.e. there is no activity on the bus to device C), as it may not have continuous access to Device C. When Device C is able to accept data, the DUT will then send data to Device C. With this non-uniform traffic flow across each of the interfaces, the demands on the DUT are different, depending on the situation in the system at any time. The DUT will be asked to communicate across any subset of all the interfaces, and the subset changes over time. The times that there is continuous traffic flowing across each of the interfaces at the same time constitute a "fully employed" situation.

Under such a type of configuration, it is required that the DUT be able to provide sufficient performance across each interface as it is needed. Failure to do so can result in unwanted system latency or even an overflow of the buffers inside the DUT (loss of Data). If the DUT was implemented in such a way that a fundamental premise of operation is having each interface be serviced at the proper rate, failure to "keep up" on any of the interfaces can put the DUT in a state from which there is no recovery.

Most of the time, the peak rate across an interface to each device is always the same, but some systems have a mechanism that allows a bus to operate at more than one bandwidth, as specified by the interface. In this case the bus will dynamically be changing transfer rates. For such a situation, the DUT must be able to respond very quickly to this specific real-time performance demand.

The problem is to ensure that the DUT can provide adequate bandwidth to and from each of the devices in the system under the many stressful scenarios described above. A major embodiment of the present invention, solves the problem by surrounding the DUT with models capable of providing random bursts across each bus.

Another major embodiment, is that the present invention performs measurements on each individual bus against a performance criteria during each of the bursts, even when the burst rate across a particular bus is changing from one burst to the next. The performance criteria consists of a transfer rate, start up latency after the beginning of the burst, and ending latency for the end of a burst.

Figure 2:
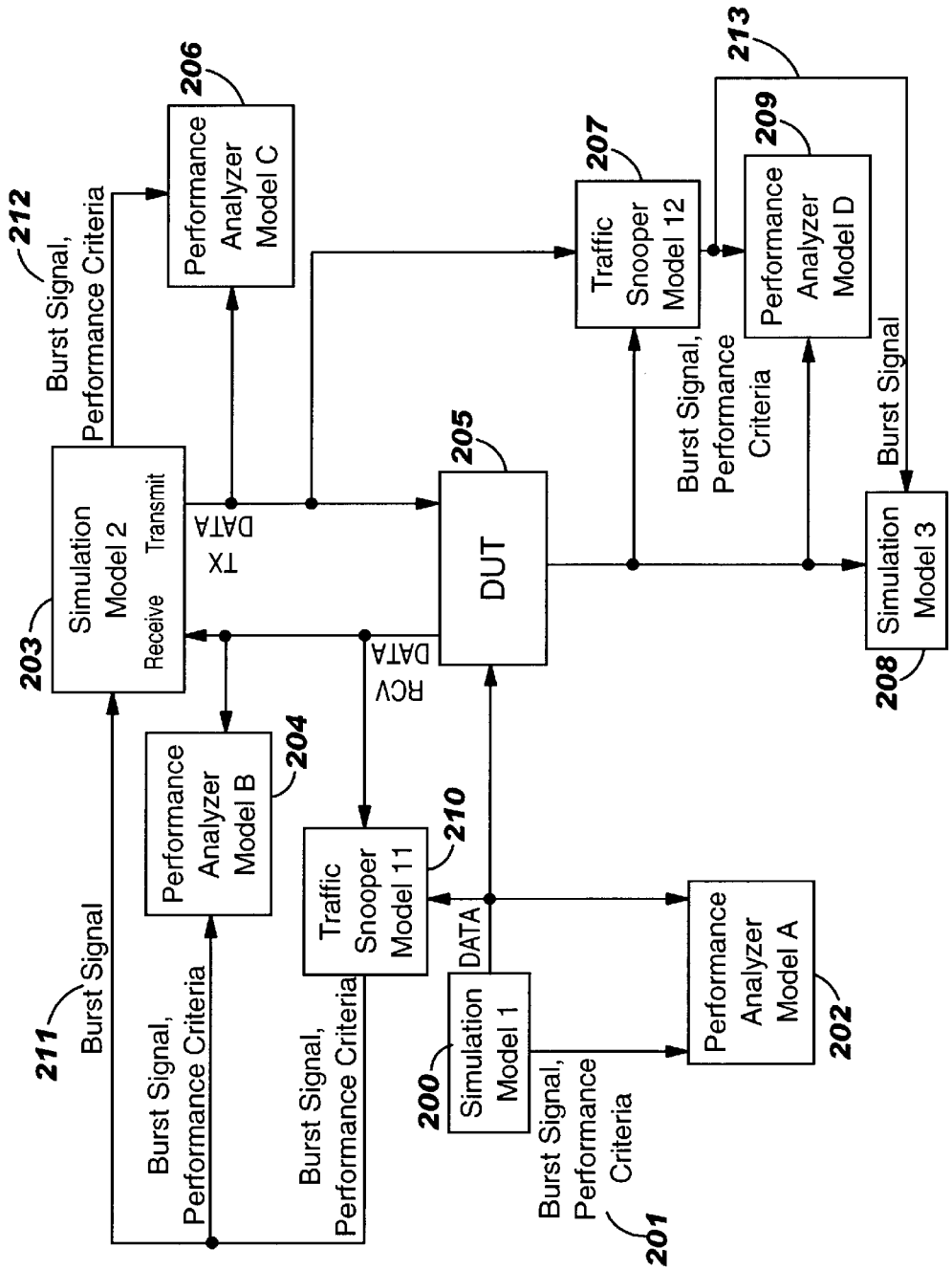
FIG. 2 Shows the detailed implementation of the present invention, as addressed to a specific situation.

FIG. 2 demonstrates an implementation of the present invention to address the system shown in FIG. 1 in great detail. In FIG. 2, data is introduced into the system by Simulation Model 1 at location 200 as a series of bursts with randomly chosen burst durations and randomly chosen periods between bursts. When the data-transfer burst is active, Simulation Model 1 at location 200 asserts a Burst Signal and sets the Performance Criteria at location 201 and sends both of these to Performance Analyzer Model A at location 202. Performance Analyzer Model A at location 202 will perform bandwidth measurements against the Performance Criteria while the Burst signal is active at location 201.

Traffic Snooper Model 11 at location 210 keeps track of how many data transfers have exited Simulation Model 1 at location 200, how many are currently buffered in the DUT at location 205, and how many have entered Simulation Model 2 at location 203. By tracking the amount of data buffered in the DUT at location 205, Traffic Snooper Model 11 at location 210 can keep track of how much data is available for each burst. It can then use its own decision criteria to enable and disable the receive path to Simulation Model 2 at location 203 when it is assured that there will be a constant stream of data flowing across the interface while it is enabled. It asserts a Burst Signal and sets the Performance Criteria at location 211 and sends both of these to Performance Analyzer Model B at location 204. This gives the behavior of random bursts of traffic, and measurements are performed by Performance Analyzer Model B at location 204 against the measurement criteria while the Burst signal is active at location 211.

Simulation Model 2 at location 203 keeps track of the amount of receive data it has buffered and can issue random bursts of data to the DUT at location 205 while asserting a Burst Signal and setting the Performance Criteria at location 212 and sending these to Performance Analyzer Model C at location 206. If Simulation Model 2 at location 203 has a mode where the burst rates can differ from one burst to the next, it can change the Performance Criteria at location 212 being sent to Performance Analyzer Model C at location 206 to match the required bandwidth. Simulation Model 2 at location 203 can then follow a burst of traffic at one speed with another burst of traffic at another speed with performance measurement always enabled for both bursts, thus testing dynamically changing performance requirements across that data bus.

Traffic Snooper Model 12 at location 207 works in the same fashion as Traffic Snooper Model 11 at location 210 in that it keeps track of how many data transfers have exited Simulation Model 2 at location 203, how many are currently buffered in the DUT at location 205, and how many have entered Simulation Model 3 at location 208, It can then use its own decision criteria to enable and disable the receive path to Simulation Model 3 at location 208, with the burst signal 213, when it is assured that there will be a constant stream of data flowing across the interface while it is enabled. It asserts a Burst Signal and sets the Performance Criteria at location 213 and sends both of these to Performance Analyzer Model D at location 209. This produces random bursts of traffic, and measurements are performed by Performance Analyzer Model D at location 209 against the measurement criteria while the Burst signal is active at location 213.

If any of the interfaces do not meet the measurement criteria during a burst, an error is flagged by the appropriate performance analyzer model, and changes can be made to the DUT at location 205 to solve the problem.

This invention does not prevent one of the interfaces from running at a non-bursting speed. In this case, the burst signal would not be activated, but the other interfaces could still run in the burst mode with the performance checking enabled for those interfaces. This would allow further performance verification of the DUT.

As noted earlier, a main embodiment and advantage of the present invention is that the interface to each device has its performance verified independent of what else is happening in the system. Even if the complete system is not running at a sustained bandwidth, performance across each interface that is bursting can always be verified.

As noted earlier the common problem associated with this type of device is ensuring and verifying that it can meet the execution rate requirement of the receive and transmit paths of each secondary device. The present invention solves the problem, as stated above, by making each Device surrounding the DUT act in "Bursts" of activity . With this scheme, the DUT can "transition" into constant bandwidth mode across all interfaces in a variety of ways, with performance checking enabled for each individual task while performing the transition. In addition, the entire system does not have to be operating at a given time (i.e. not every interface to the DUT is active) in order to measure performance.

Others have tried to resolve this problem of checking the performance by running the entire system at "full-bandwidth, fully employed mode" (all interfaces active with a continuous stream of data), and the output throughput is checked at the place where the data exits the system. This scheme will not be able to measure bandwidth when only portions of the system are running at full bandwidth. It will also not measure the ability of each interface to respond to requests for data. The present invention will measure the bandwidth at each intermediate point, ensuring that there is no loss in performance in situations where the entire system is not fully employed, but some portions of the system are required to run at a sustained rate.

Although certain preferred embodiments have been shown and described, it will be understood that many changes and modifications may be made therein without departing from the scope and intent of the appended claims.

What is claimed is:

1. On a computer network a system for independently verifying the execution rate of individual tasks of devices comprising:

a simulated model of a main device, including device under test that can transition into constant bandwidth mode across all interfaces, with interfaces to receive and to transmit data;

a plurality of simulated models of various devices wherein one of each of the simulated models is operatively coupled to one of the interfaces;

a separate bus interconnecting each interface to one of the simulated models; and circuit arrangement associated with the system for varying data traffic and associated transfer rate.

2. The system of claim 1 wherein under said constant bandwidth mode, performance is enabled for each individual task, while performing the transition.

3. The system of claim 2 wherein the entire system does not have to be operating at a given time in order to measure performance.

4. On a computer network, a method for independently verifying execution rate of individual tasks by a device, comprising acts of:

providing a simulation model including a simulated device under test with plurality of interfaces, a plurality of simulated models of various devices and a plurality of buses bone of each coupling an interface to one of the plurality of simulated devices;

generating variable data traffic with associated transfer rate from selected ones of said simulated devices;

forwarding to said device under test the data traffic so generated;

measuring latency across each bus at the beginning of each burst of activity; and facilitating use of said device under test, to transition into constant bandwidth mode across all interfaces.

5. The method of claim 4, further including the acts of:

performance, under said constant bandwidth mode, is enabled for each individual task, while performing the transition.

6. The method of claim 5, further including the acts of:

measuring performance, when the entire system does not have to be operating at a given time.

7. An article of manufacture including a computer readable media in which a computer program is embedded, said computer program includes instructions providing a simulation model including a simulated device under test with plurality of interfaces, a plurality of simulated models of various devices and a plurality of buses one of each coupling an interface to one of the plurality of simulated devices;

instructions for generating variable data traffic with associated transfer rate from selected ones of said simulated devices;

instructions that cause the device under test to transition into constant bandwidth mode across all interfaces; and instructions to forward the variable data traffic to the device under test.

8. The article of manufacture of claim 7, wherein under said constant bandwidth mode, performance is enabled for each individual task, while performing the transition.

9. The article of manufacture of claim 8, wherein the entire system does not have to be operating at a given time in order to measure performance.

* * * * *